(12) United States Patent
Sharma et al.

US011139296B2

(10) Patent No.: US 11,139,296 B2
(45) Date of Patent: Oct. 5, 2021

(54) CMOS CIRCUIT WITH VERTICALLY ORIENTED N-TYPE TRANSISTOR AND METHOD OF PROVIDING SAME

(71) Applicant: Intel Corporation, Santa Clara, CA (US)

(72) Inventors: Abhishek A. Sharma, Hillsboro, OR (US); Van H. Le, Portland, OR (US); Gilbert Dewey, Hillsboro, OR (US); Willy Rachmady, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 663 days.

(21) Appl. No.: 15/941,384

(22) Filed: Mar. 30, 2018

(65) Prior Publication Data

US 2019/0304974 A1    Oct. 3, 2019

(51) Int. Cl.
*H01L 27/092* (2006.01)
*H01L 27/12* (2006.01)
*H01L 23/528* (2006.01)
*H01L 29/24* (2006.01)
*H01L 29/423* (2006.01)
*H01L 29/66* (2006.01)
(Continued)

(52) U.S. Cl.
CPC ...... *H01L 27/092* (2013.01); *H01L 21/02565* (2013.01); *H01L 21/02592* (2013.01); *H01L 21/823871* (2013.01); *H01L 21/823885* (2013.01); *H01L 23/528* (2013.01); *H01L 27/1207* (2013.01); *H01L 29/247* (2013.01); *H01L 29/42392* (2013.01); *H01L 29/66969* (2013.01); *H01L 29/78642* (2013.01); *H01L 29/78693* (2013.01)

(58) Field of Classification Search
CPC ..... H01L 21/823412; H01L 21/823475; H01L 21/823487; H01L 27/0922; H01L 29/78642
See application file for complete search history.

(56) References Cited

U.S. PATENT DOCUMENTS

2020/0258884 A1* 8/2020 Rachmady .......... H01L 29/2003

OTHER PUBLICATIONS

International Patent Application No. PCT/US17/54601, filed Sep. 29, 2017.

* cited by examiner

*Primary Examiner* — Daniel P Shook
(74) *Attorney, Agent, or Firm* — Green, Howard & Mughal LLP

(57) ABSTRACT

Techniques and mechanisms for providing a space efficient complementary metal-oxide-semiconductor (CMOS) circuit. In an embodiment, a p-type transistor of a circuit is to conduct current in a direction parallel to a surface of a semiconductor substrate, wherein an n-type thin film transistor (TFT) of the circuit is to conduct current in a direction which is orthogonal to the surface. A first interconnect is directly coupled to each of the two transistors, wherein the first interconnect, a high mobility channel structure of the n-type TFT, and a source or drain of the p-type transistor are on the same line of direction. A second interconnect comprises a conductive path which extends to respective gates of the p-type transistor and the n-type TFT, wherein the conductive path is limited to a region over a footprint of the p-type transistor. In another embodiment, functionality of a logical inverter is provided with the circuit.

22 Claims, 9 Drawing Sheets

(51) Int. Cl.
*H01L 29/786* (2006.01)
*H01L 21/8238* (2006.01)
*H01L 21/02* (2006.01)

CMOS CIRCUIT WITH VERTICALLY ORIENTED N-TYPE TRANSISTOR AND METHOD OF PROVIDING SAME

BACKGROUND

1. Technical Field

Embodiments of the present invention generally relate to microelectronic devices and their methods of fabrication, and more particularly, but not exclusively, to a space efficient arrangement of transistors.

2. Background Art

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers flow from the source to the drain. Complementary metal-oxide-semiconductor (CMOS) circuitry typically use a combination of a p-type metal-oxide-semiconductor (pMOS) FET and a n-type metal-oxide-semiconductor (nMOS) FET to implement logic gates and other digital circuits.

Higher performance, lower cost, increased miniaturization of integrated circuit components, and greater packaging density of integrated circuits are ongoing goals in the microelectronic industry for the fabrication of semiconductor devices. As these goals are achieved, the semiconductor devices scale down (i.e., become smaller), which increases the need for efficiency in the manufacture and use of each integrated circuit component. As a result, a premium is placed on incremental improvements to space efficient circuit architectures which do not sacrifice device performance.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
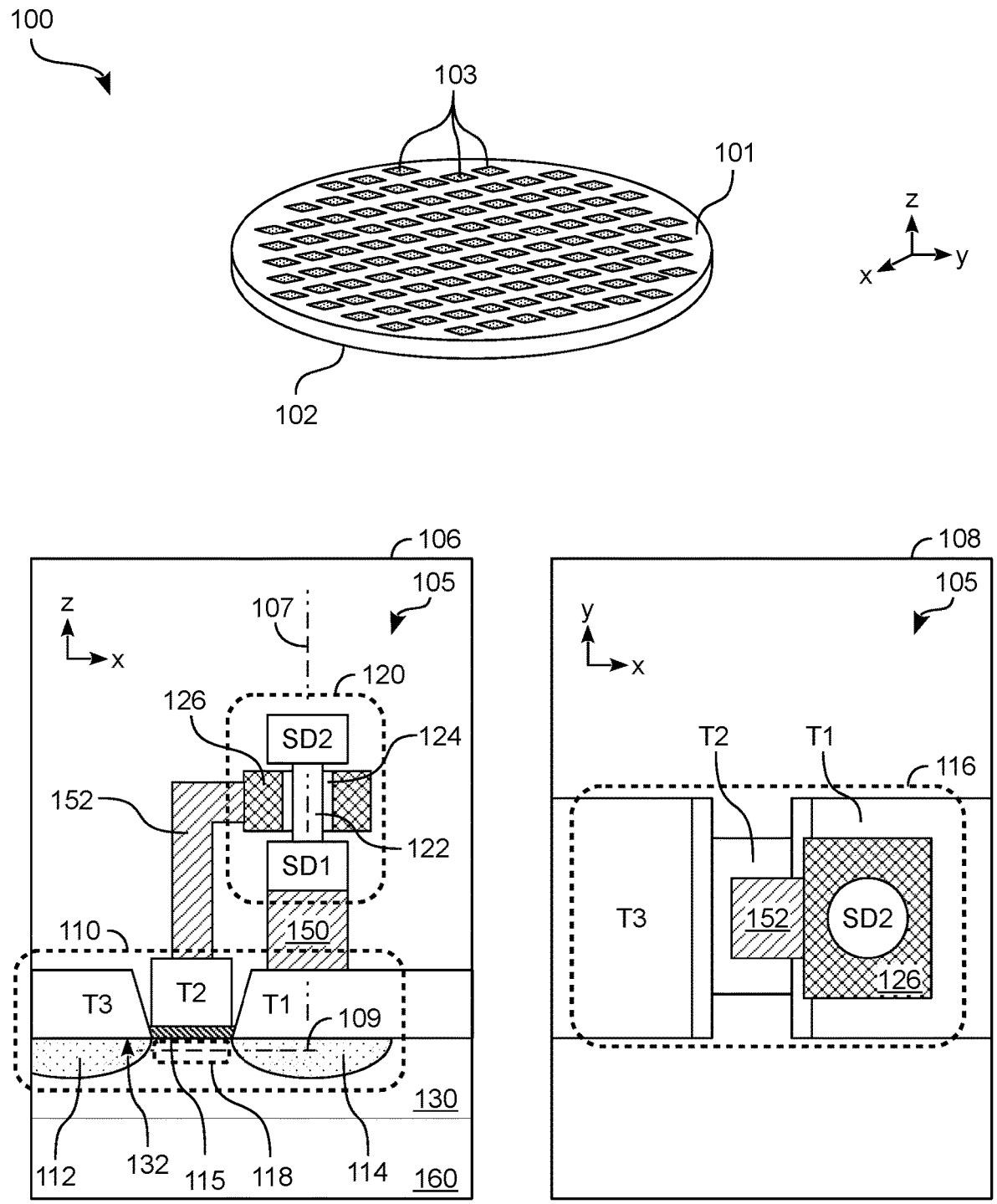
FIG. 1 shows cross-sectional views of an integrated circuitry including a CMOS circuit according to an embodiment.

Embodiments discussed herein variously include techniques and/or mechanisms for efficiently providing a space-efficient CMOS circuit. In some embodiments, a CMOS circuit comprises a p-type transistor and an n-type thin film transistor (TFT) coupled thereto, wherein the p-type transistor is configured to provide a first channel which conducts current along a surface of a semiconductor body (e.g., in or over a semiconductor substrate). The n-type TFT may provide a second channel which conducts current along a direction which is orthogonal to the surface of the semiconductor body. In one such embodiment, each of the p-type transistor and the n-type TFT includes a respective source or drain which is coupled directly to a first interconnect—e.g., wherein a channel structure of the n-type TFT is aligned over the first interconnect and a source or drain of the p-type transistor. A second interconnect may comprise a conductive path which extends to respective gates of the p-type transistor and the n-type TFT—e.g., wherein the conductive path is limited to a region over a footprint of the p-type transistor.

As used herein, "source or drain structure," "source/drain structure," and "SD structure" variously refer to a structure which is configured to function as one of a source of a device or a drain of the device. A SD structure may comprise at least a doped semiconductor region and, in some embodiments, a conductive surface which provides a contact electrode that adjoins a semiconductor material. "Channel structure" refers herein to a structure of a device which, during operation of the device, may be used to selectively provide a conductive channel between two SD structures of the device. A contiguous body of one or more semiconductor materials (or "semiconductor body" herein) may include or function as a channel structure. Such a body may be only a portion of a larger contiguous semiconductor body—e.g., wherein the portion extends between and adjoins each of a source and a drain of a transistor.

As used herein "horizontal transistor" refers to a transistor comprising structures variously disposed in or on a substrate, wherein the transistor is to provide a channel which conducts current in parallel with a surface of the substrate. The semiconductor body may include a substrate, for example, and/or one or more semiconductor layers grown on such a substrate. By contrast, "vertical transistor" and "vertical TFT" variously refer herein to a transistor configured to provide a channel which is substantially orthogonal—e.g., to within ten degrees) (10°)—to the above-described surface of a substrate.

Some embodiments enable operation of a space-efficient CMOS circuit wherein a channel structure of the vertical n-type transistor—e.g., the channel structure comprising a vertical nanowire—is arranged over a source or drain of the horizontal p-type transistor. Such a channel structure may comprise a high-mobility semiconductor material to accommodate operation with a channel capacity and/or other operational characteristics of the horizontal p-type transistor. As used herein with reference to a semiconductor material, "high mobility" refers to the property of the material having a carrier mobility which is equal to or greater than 100 cm$^2$/V·s.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including CMOS circuitry.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including transistors of an integrated circuit.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/− 10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). It is pointed out that those elements of a figure having the same reference numbers (or names) as the elements of any other figure can operate or function in any manner similar to that described, but are not limited to such.

Referring to FIG. 1, a perspective view of a microelectronic wafer 100 according to an embodiment is shown. Wafer 100 may be made of a silicon wafer having a plurality of "streets" or severance lines formed in a lattice pattern on an active surface 101 thereof, and integrated circuit chips 103 formed as function elements in a plurality of areas sectioned by the plurality of severance lines. Wafer 100 may have a backside 102 opposite the active surface 101 as shown.

FIG. 1 also shows—in a cross-sectional side view 106 and a top view 108—an example of integrated circuitry 105 such as that of one of integrated circuit chips 103. Integrated circuitry 105 is one example of a CMOS circuit which, according to an embodiment, includes a horizontal p-type transistor and a vertical n-type TFT coupled thereto. A conductive path of an interconnect extends to each of a first gate of the p-type transistor and a second gate of the vertical n-type TFT, wherein the conductive path is limited to a region over a footprint of the p-type transistor.

In the example embodiment shown, integrated circuitry 105 includes horizontal p-type transistor 110, at least some structures of which extend over a semiconductor material 130. In turn, semiconductor material 130 may be disposed directly or indirectly on a bulk semiconductor (e.g., silicon) substrate 160. Semiconductor layer 130 may comprise one or more epitaxial single crystalline semiconductor layers which—for example—are grown atop a different bulk semiconductor substrate (such as the illustrative silicon substrate 160 shown). Each of such one or more layers may, for example, comprise a respective one of silicon, germanium, silicon germanium, gallium arsenide, indium phosphide, indium gallium arsenide, aluminum gallium arsenide, or other suitable semiconductor material.

Although some embodiments are not limited in this regard, semiconductor layer 130 may comprise various epitaxially grown semiconductor sub-layers having different lattice constants. Such semiconductor sub-layers may serve to grade the lattice constant along the z-axis of the xyz coordinate system shown. For example, a germanium concentration of SiGe in semiconductor layer 130 may increase from 30% germanium at the bottom-most buffer layer to 70% germanium at the top-most buffer layer, thereby gradually increasing the lattice constant.

Horizontal p-type transistor 110 may include any of a variety of planar designs or non-planar designs, in different embodiments. For example, horizontal p-type transistor 110 may be a finFet transistor, trigate transistor, thin film transistor or the like. In the illustrative embodiment shown, horizontal p-type transistor 110 comprises doped source/drain regions 112, 114 as well as a gate dielectric 115 which extends on at least a portion of a surface 132 of semiconductor material 130. Gate dielectric 115 may include a high-k gate dielectric, such as hafnium oxide. In various other embodiments, gate dielectric 115 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate. In another embodiment, gate dielectric 115 includes silicon dioxide. Regions 112, 114 are doped with a p-type dopant such as boron.

Terminal structures of the horizontal p-type transistor 110 (e.g., including two or more of the illustrative terminals T1, T2, T3 shown) may be directly or indirectly disposed on surface 132. Such terminal structures may, for example, include a gate terminal and at least one source or drain terminal. In the example embodiment shown, terminal T2 is a gate terminal, and source or drain terminals are each provided by a respective one of terminals T1, T3.

A semiconductor body 118—e.g., formed by a region of semiconductor material 130 at a portion of side 132—may extend between (and adjoin) source/drain regions 112, 114 along a line 109, the semiconductor body 118 to provide a channel structure of horizontal p-type transistor 110. Line 109 may be parallel to a side of a substrate (such as substrate 160, for example and/or a substrate structure which includes semiconductor material 130). Gate dielectric 115 and terminal T2 may variously extend over the portion of the side 132 at semiconductor body 118. For example, source/drain regions 112, 114 may extend to (and in some embodiments, under) laterally opposite sides of gate dielectric 115. During operation of circuitry 105, current may be conducted between source/drain regions 112, 114 in semiconductor body 118 based on a voltage at terminal T2—e.g., wherein gate dielectric 115 provides some electrical insulation between terminal T2 and the channel region which adjoins gate dielectric 115.

Integrated circuitry 105 may further comprise a vertical n-type TFT 120 which is coupled to horizontal p-type transistor 110 via an interconnect 150 and via another interconnect 152. In an embodiment, interconnect 150 is directly coupled to (or is part of) some portion of terminal T1. Interconnect 152 may be directly coupled to some portion of the gate provided with terminal T2—e.g., wherein interconnect 152 is further directly coupled to a gate 126 of n-type TFT 120.

Vertical n-type TFT 120 is one example a n-type transistor, a channel structure of which includes a high mobility semiconductor configured to conduct current in a direction (e.g., parallel to the z-axis shown) that is orthogonal to another direction (in the x-y plane, for example) in which the portion of surface 132 extends. For example, vertical n-type TFT 120 may include source or drain regions SD1, SD2 and a high mobility semiconductor body 122 disposed therebetween. Semiconductor body 122 may be formed of any of a variety of suitable semiconductor materials including, but not limited to, one of InGaZO, zinc oxide, InO, GaO, $TiO_2$, AZO, ITO, IZO, polysilicon, Ge, alloys thereof, etc. For example, semiconductor body 122 may include oxygen and one of indium, gallium, zinc, titanium, or tin. In some embodiments, a gate dielectric 124 extends around semiconductor body 122 to at least partially insulate semiconductor body 122 from gate 126, which in turn extends around gate dielectric 124. During operation of circuit 105, gate 126 may facilitate control of a conductive channel in semiconductor body 122. For example, semiconductor body 122 may comprise a high mobility material to conduct current between source or drain regions SD1, SD2 based on a voltage provided to gate 126.

Integrated circuitry 105 provides a space efficient arrangement wherein n-type TFT 120 is aligned vertically over one or more structures of p-type transistor 110, and wherein a conductive path—extending to respective gate structures of p-type transistor 110 and n-type TFT 120—is limited to a region over a footprint of p-type transistor 110. For example, a centerline or other portion of semiconductor body 122 may be on a line (such as the illustrative vertical line 107 shown) which is orthogonal a side of substrate 160—e.g., wherein line 107 is orthogonal to the portion of surface 132 which is formed at semiconductor body 118. Semiconductor body 122 may extend along line 107 in a direction from one of SD1 or SD2 toward the other one of SD1 or SD2—e.g., where interconnect 150 and one or both of terminal T1 and doped SD region 114 are also on line 107.

Furthermore, as variously shown in views 106, 108, some portion of interconnect 152 may form a conductive path which extends both to terminal T2 and to gate 126. That portion of interconnect 152 (and the conductive path formed thereby) may be limited to a region which is vertically over a footprint 116 of p-type transistor 110. Footprint 116 may be defined by a maximum horizontal extent (in an x-y plane) of structure of p-type transistor 110. Although interconnect 152 may include other portions (not shown) which extend outside of such a region, such portions may be in extraneous to the conductive path between terminal T2 and gate 126. For example, interconnect 152 may be further coupled to receive a first signal representing a first logic state, wherein interconnect 150 is coupled to output a second signal representing a second logic state based on the first logic state.

Figure 2:
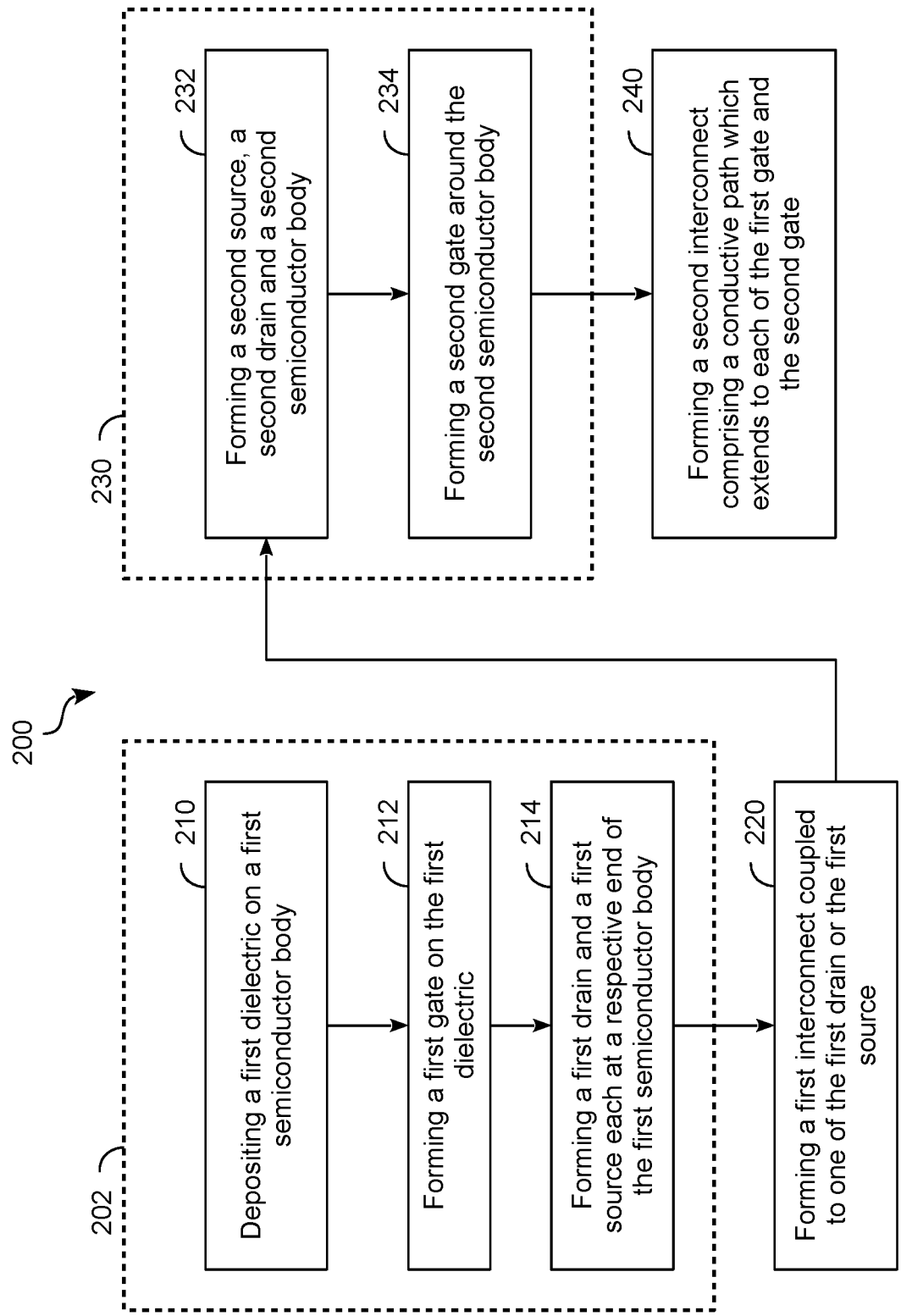
FIG. 2 is a flow diagram illustrating elements of a method for providing integrated circuit structures according to an embodiment.

FIG. 2 shows features of a method 200 to provide CMOS circuitry according to an embodiment. Method 200 may include processes to fabricate some or all of the structure of integrated circuitry 105, for example. To illustrate certain features of various embodiments, method 200 is described herein with reference to structures shown in FIGS. 3A-3C. However, any of a variety of additional or alternative structures may be fabricated according to method 200, in different embodiments.

As shown in FIG. 2, method 200 may include operations 202 to form a horizontal p-type transistor of a CMOS circuit, the p-type transistor comprising a first drain, a first source, a first gate, and a first semiconductor body (e.g., a channel structure) which extends between the first source and the first drain along a first line. The first line may be parallel to a surface of a substrate such as substrate 160 (or a substrate formed by semiconductor material 130). Operations 202 may further form the gate dielectric layer directly or indirectly on a surface of the first semiconductor body (e.g., a channel structure), wherein the gate dielectric layer is between the gate and the first semiconductor body.

By way of illustration and not limitation, operations 202 may include (at 210) depositing a first dielectric on a first semiconductor body. Operations 202 may further comprise (at 212) forming a first gate on the first dielectric, and (at 214) forming a first drain and a first source each at respective end of the first semiconductor body.

Figure 3A:
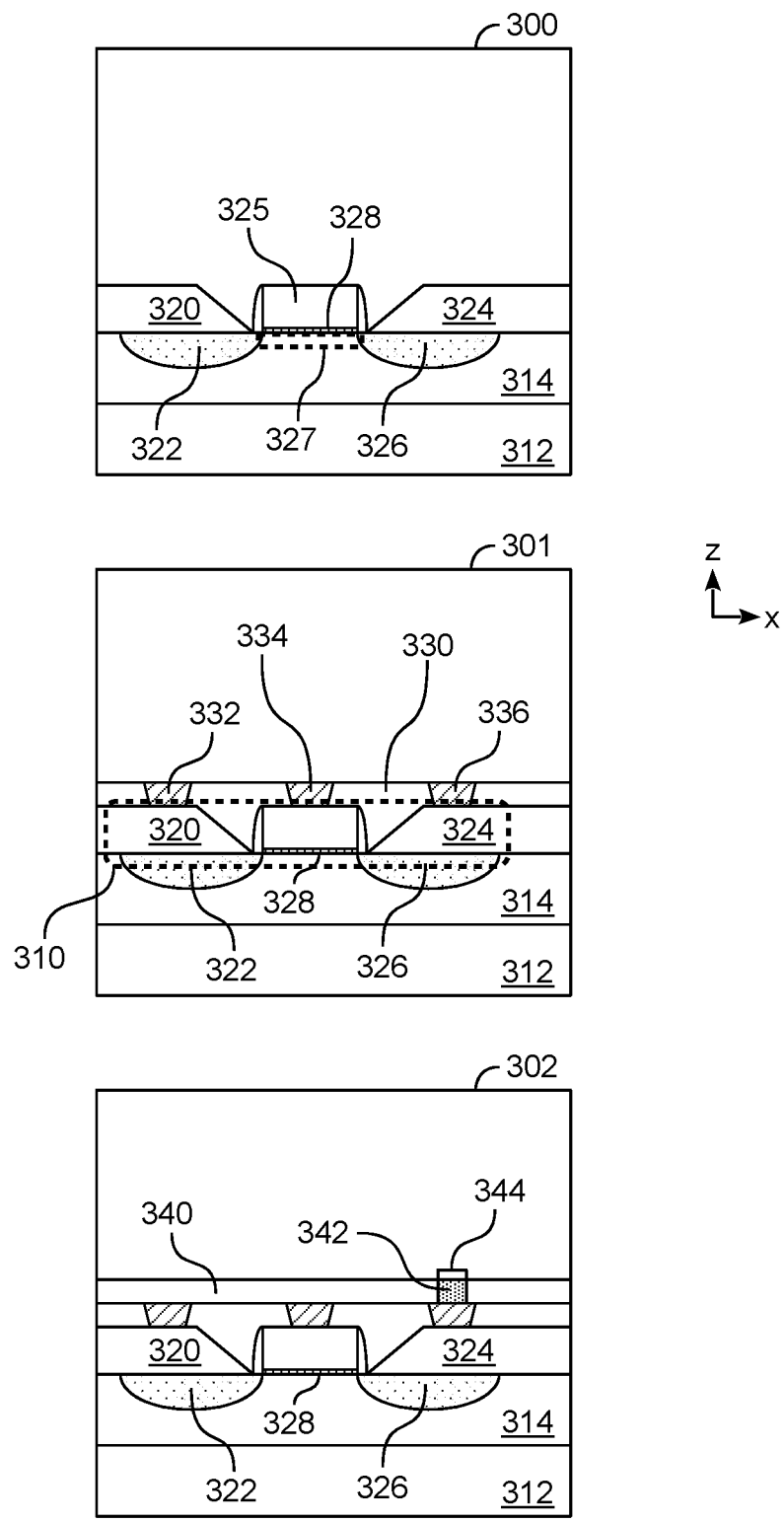
FIGS. 3A-3C show cross-sectional diagrams each illustrating respective structures at a corresponding stage of semiconductor fabrication processing according to an embodiment.
Figure 3B:
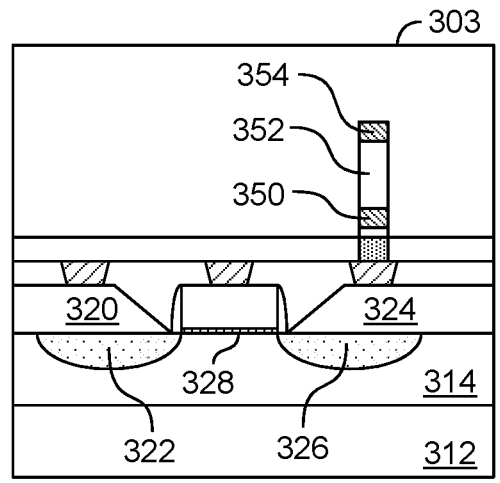
Figure 3B:
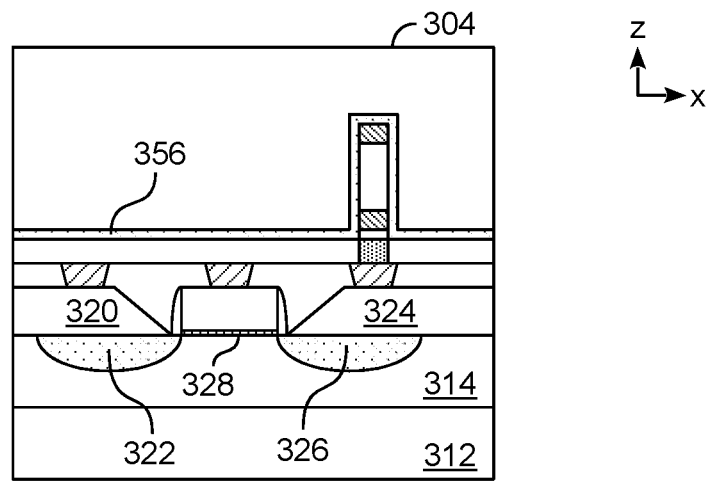
Figure 3B:
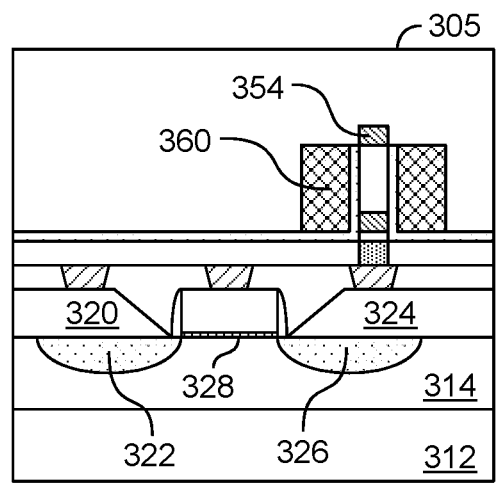
Figure 3C:
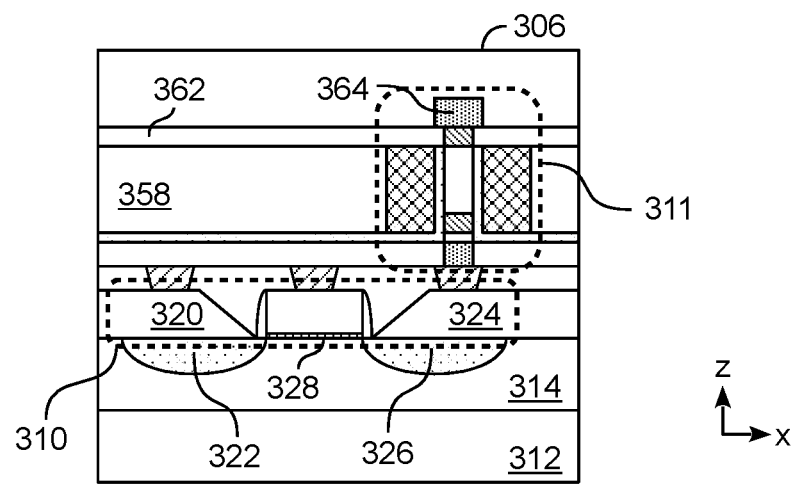
Figure 3C:
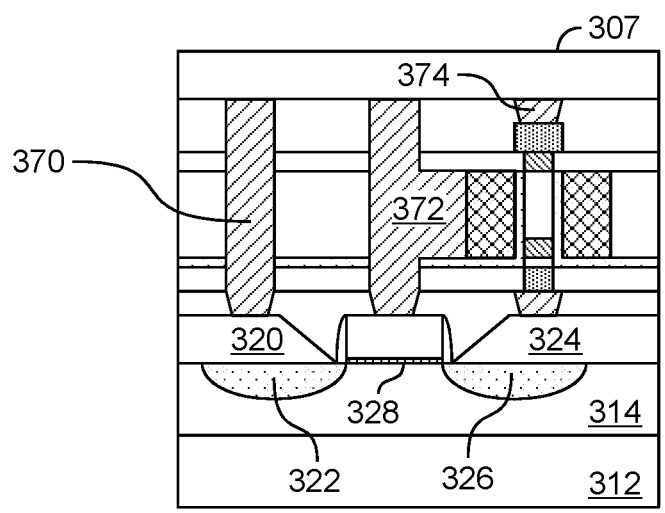

For example, referring now to FIGS. 3A-3C, cross-sectional side views are shown for respective stages 300-307 of processing to fabricate transistor structures according to an embodiment. As shown at stage 300, a body 327 of one or more semiconductor layers 314 is disposed between a substrate 312 and a layer 328 comprising a dielectric—e.g., where body 327 and layer 328 correspond functionally to semiconductor body 118 and gate dielectric 115, respectively. Layer 328 may include a gate dielectric material such as but not limited to $Al_2O_3$, $HfO_2$, $ZrO_2$, TiSiO, HfSiO or $Si_3N_4$. In an embodiment, the layer 328 has a thickness that is approximately in the range of 2 nanometers (nm) to 10 nm. Substrate 312 may include a semiconductor material such as but not limited to silicon, silicon germanium (SiGe) or silicon carbide (SiC). In an embodiment, the one or more semiconductor layers 314 are grown on substrate 312 by a chemical vapor deposition (CVD) process.

Operations 202 may include the various forming of structures of a horizontal p-type transistor in semiconductor material 314 and/or on a side of semiconductor material 314—e.g., where a portion of said side is formed by a surface of semiconductor body 327. Such structures may include doped source or drain regions 322, 326 formed in semiconductor material 314 on opposite respective sides of semiconductor body 327. In some embodiments, raised source or drain structures 320, 324 may be deposited over doped source or drain regions 322, 326 (respectively), and a gate structure 325 may be formed on layer 328. Some or all of layer 328, gate structure 325, raised source or drain structures 320, 324, and doped source or drain regions 322, 326 may be formed by masking, patterning (e.g., photolithography), deposition, etching, and/or other operations which, for example, are adapted from conventional semiconductor fabrication techniques. The raised source or drain structures 320, 324 may each include a respective one or more conductive layers. Although some embodiments are not limited in this regard, raised source or drain structures 320, 324 may further comprise one or more semiconductor layers including, but not limited to, silicon or silicon germanium.

As shown at stage 301, a horizontal p-type transistor 310—resulting from operations 202, for example—may comprise gate structure 325, layer 328, doped source or drain regions 322, 326, and raised source/drain structures 320, 324. Subsequent processing of method 200 may provide a direct coupling of a first interconnect to each of the p-type transistor and a vertical n-type TFT. For example, method 200 may further comprise (at 220) forming a first interconnect which is coupled to one of the first source or the first drain.

Referring again to stage 301, connectivity of other circuit structures with horizontal p-type transistor 310 may be facilitated at least in part by a dielectric 330 being formed on gate structure 325 and raised source/drain structures 320, 324. Such formation may include blanket deposition of an insulator material using a process such, as but limited to, a plasma-enhanced chemical vapor deposition (PECVD), chemical vapor deposition (CVD) or physical vapor deposition (PVD). The insulator material may include any of various compounds such as but not limited to silicon oxide, silicon oxynitride or silicon carbide.

Subsequent mask and etch processing may form in dielectric 330 holes to accommodate the deposition therein of various metallization structures (such as the illustrative interconnect structuress 332, 334, 336 shown). For example, the insulator material may be plasma etched through a mask—or alternatively, reactive-ion etched utilizing a chemistry including Ar, $O_2$, CO and a fluorocarbon such as but not limited to $CHF_3$, $CH_2F_2$, or $C_4F_8$—to expose respective portions of gate structure 325 and raised source/drain structures 320, 324. Interconnect structuress 332, 334, 336 may each include any of a variety of conductors including, but not limited to, Ni, Ti, Pt or W. In one embodiment, gate structure 325 (for example) includes a work function layer such as but not limited to Pt, Ni, TiN or TaN. In such an embodiment, the gate structure 325 may include a gate cap metal (not shown) on the work function layer—e.g., wherein the gate cap metal is tungsten.

As shown at stage 302, patterned metallization layer 340, including a via 342 formed therein, may be formed on dielectric 330. Fabrication of patterned metallization layer 340 may include operations similar to those described herein for fabrication of dielectric 330 and interconnect structures 332, 334, 336. A seed layer 344 (e.g., comprising gold) may be selectively deposited at least on a top surface of via 342.

Referring again to FIG. 2, method 200 may further comprise operations 230 to form a vertical n-type TFT which is to be directly coupled to the first interconnect. For example, operations 230 may comprise (at 232) forming a second source, a second drain and a second (high mobility) semiconductor body which extends between the second source and the second drain along a line which is orthogonal to the surface of the first semiconductor body. Operations 230 may further comprise (at 234) forming a second gate around the high mobility second semiconductor body. In an embodiment, a second dielectric is also formed around the second semiconductor body—e.g., wherein the second dielectric is between the second gate and the second semiconductor body.

For example, as shown at stage 303, deposition processing may successively from on seed layer 344 a n-type doped source or drain structure 350, channel structure 352, and n-type doped source or drain structure 354. In one embodiment, respective materials of channel structure 352 and n-type doped source or drain structures 350, 354 may be variously deposited to form a nanopillar structure—e.g., using a process called Vapor-Liquid-Solid (VLS) epitaxial growth process. VLS may facilitate small area (e.g., less than 10 $nm^2$) one-dimensional crystal growth on seed layer 344—e.g., wherein said growth is assisted by a metal catalyst. The metal catalyst may form liquid alloy droplets at a high temperature by adsorbing vapor components. For example, metal colloids (e.g., gold or nickel) may be exposed to a silicon source gas (e.g., $SiH_4$) and high temperature. The silicon source gas may be dissolved into the colloidal particles and silicon sections grown on the colloids. Supersaturation may drive precipitation of an alloy component at a liquid—solid interface, resulting in crystal growth which is primarily one-dimensional (e.g., along the z-axis shown). Vapor components may be varied during VLS processes—e.g., including the selective inclusion or exclusion of n-type dopant to be included in n-type doped source or drain structures 350, 354, and for channel structure 352 to include an intrinsic semiconductor material.

In another embodiment, the channel structure 352 and n-type doped source or drain structures 350, 354 may be deposited using operations—e.g., adapted from conventional lithography and etching processes—in which a thin silicon film is deposited on the patterned metallization layer 340, using method such as CVD or plasma enhanced CVD, and patterned (e.g., etching) to form an individual nanowire.

Formation of channel structure 352 may take place at a temperature which is sufficiently low to prevent or otherwise mitigate damage to some or all of the previously formed structures of horizontal p-type transistor 310. Due to such low temperature processing, channel structure 352 may be an amorphous semiconductor, or crystallites of channel structure 352 (if any) may have an average size which is below 5 nm. For example, the average size of any such crystallites may be in a range of 0.5 nm to 5 nm (e.g., within a range of 0.5 nm to 2 nm).

At stage 305, a gate structure 360 may be deposited to variously extend around channel structure 352 and n-type doped source or drain structures 350, 354. In such an embodiment, dielectric 356 provides partial electrical insulation between gate structure 360 and each one of channel structure 352 and n-type doped source or drain structure 350, 354. Polishing may subsequently be performed to remove a top portion of dielectric 356, thereby exposing a surface of n-type doped source or drain structure 354.

As shown at stage 306, other dielectric structures (such as the illustrative dielectric films 358, 362 shown) may subsequently be deposited—e.g., in preparation for metallization processes. Formation of dielectric films 358, 362 may include features of processing such as that to form dielectric 330, for example. A source or drain contact structure 364 may then be grown on n-type doped source or drain structure 354. In one example embodiment, source or drain contact structure 364 includes any of a variety of suitable conductors including, but not limited to, one of titanium nitride, tungsten, platinum, iridium, gold, ruthenium, a p-type doped polysilicon, zinc, or gallium. A resulting vertical n-type transistor 311 may include channel structure 352, n-type doped source or drain structures 350, 354, and source or drain contact structure 364.

Referring again to FIG. 2, method 200 may further comprise (at 240) forming a second interconnect comprising a conductive path which extends to each of the first gate and the second gate. The conductive path may be limited to a region over a footprint of the p-type transistor. For example, as shown at stage 307, subsequent metallization structures may be deposited to facilitate further coupling of horizontal p-type transistor 310 and vertical n-type transistor 311 with each other and/or with other circuitry. By way of illustration and not limitation, additional masking, etch and metal deposition processes may be performed—e.g., thereby extending connectivity with interconnect structure 334 to form an interconnect 372 through some or all of layers 340, 358, 362. Interconnect 372 may extend to couple directly to each of gate structure 360 and gate structure 325. In some embodiments, another interconnect 370 is formed on source or drain contact structure 320. However, any of a variety of additional or alternative metallization structures may be formed at stage 307, in other embodiments. Another interconnect 374 may facilitate connectivity with source or drain contact structure 364.

As shown in the configuration at stage 307, channel structure 352 of vertical n-type transistor 311 is configured to conduct current in a first direction (e.g., parallel to the z-axis shown) between n-type doped source or drain structures 350, 354. In such an embodiment, the side 316 of one or more semiconductor layers 314 may extend—e.g., at least in a region under gate dielectric 328—in a second direction (e.g., in an x-y plane) which is orthogonal to the first direction. The channel region of horizontal p-type transistor 310 may conduct current along such a second direction—e.g., at side 316 in a region under gate dielectric 328.

Figure 4:
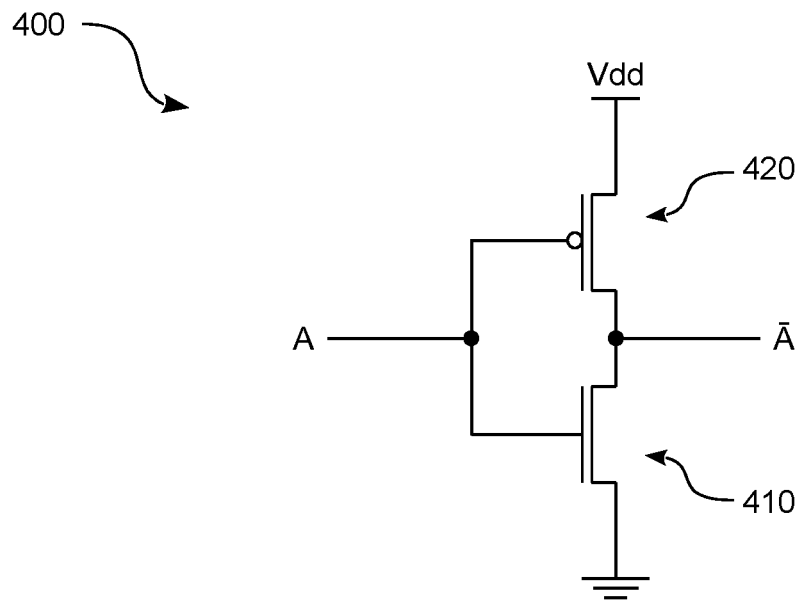
FIG. 4 is a circuit diagram illustrating a CMOS inverter including circuit structures according to an embodiment.

In some embodiments, digital logic—e.g., one of an inverter or a NAND gate—includes a p-type transistor and an n-type TFT coupled thereto. For example, FIG. 4 shows one example of a circuit 400 that may be provided with semiconductor structures fabricated according to an embodiment. Such semiconductor structures may be fabricated with processing such as that of method 200 and/or that which is illustrated by stages 300-307. Alternatively or in addition, circuit 400 may be provided with integrated circuitry 105, for example.

In the example embodiment shown, circuit 400 includes a p-type transistor 420 and a n-type transistor 410 coupled thereto—e.g., wherein p-type transistor 420 and a n-type transistor 410 correspond, respectively, to p-type transistor 110 and n-type TFT 120. Source terminals of p-type transistor 420 and n-type transistor 410 may be coupled, respectively, to a supply voltage Vdd and to a reference potential (e.g., a ground). In such an embodiment, respective drain terminals of n-type transistor 410 and p-type transistor 420 may be coupled to one another at an output node $\overline{A}$—e.g., where respective gates terminals of n-type transistor 410 and p-type transistor 420 are coupled to one another at an input node A. Circuit 400 may thus be configured to provide signal inverter functionality—e.g., wherein input node A is to receive a first signal representing a first logical state, and output node $\overline{A}$ is to provide a second signal, based on the first signal representing an opposite logical state. In one example implementation of circuit 400, transistors 420, 410 may be transistors 310, 311, respectively. For example, interconnects 370, 372, 374 may be coupled to provide—respectively—the supply voltage, the first signal, and a reference voltage—e.g., wherein interconnect 336 is to provide the second signal based on the first signal.

Figure 5:
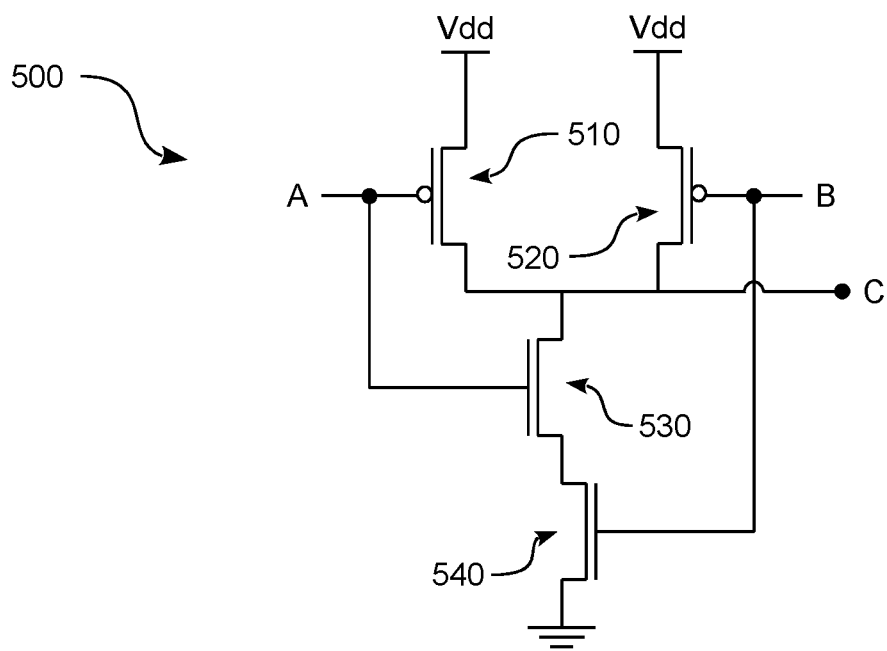
FIG. 5 is a circuit diagram illustrating a NAND gate including circuit structures according to an embodiment.

FIG. 5 shows an example of a CMOS circuit 500 according to another embodiment. Structures of CMOS circuit 500 may be fabricated with processing such as that of method 200 and/or that which is illustrated by stages 300-307. Alternatively or in addition, circuit 500 may be provided with integrated circuitry 105, for example.

In the example embodiment shown, circuit 500 includes p-type transistors 510, 520 and n-type transistors 530, 540 coupled thereto. CMOS circuit 500 may be configured to provide functionality of a NAND logical gate. For example, respective source terminals of p-type transistors 510, 520 may be coupled to a supply voltage Vdd—e.g., wherein a source terminal of n-type transistor 540 is coupled to a reference potential (e.g., ground). An in-parallel configuration of p-type transistors 510, 520 may be coupled to n-type transistor 540 via n-type transistor 530—e.g., wherein respective drains of p-type transistors 510, 520 and n-type transistor 530 are each coupled to an output node C.

In such an embodiment, the gate terminals of p-type transistors 510, 520 may be coupled to receive (respectively) an input signal A and an input signal B. Furthermore, the gate terminals of n-type transistors 530, 540 may be coupled to receive input signals A and B, respectively. At a given time during operation of CMOS circuit 500, input signals A and B may each represent a respective one of a first logical state and a second logical state. In response to such signals, output node C may provide a signal which represents a third logical state, wherein the third logical state is equal to a Boolean NAND of the first logical state and the second logical state.

In some embodiments, method 200 further comprises operations to form a vertically stacked arrangement of multiple n-type transistors. For example, additional operations—similar to operations 220—may grow or otherwise form a third drain, a third source, and a third (high mobility) semiconductor body each of a second n-type TFT. Such additional operations may further comprise directly coupling each of the n-type TFT formed by operations 230 and the second n-type TFT to a third interconnect—e.g., wherein the high mobility third semiconductor body and the third interconnect are also on the line which is orthogonal to the surface of the first semiconductor body.

In such an embodiment, the third gate may be coupled to the gate of another horizontal p-type transistor which (for example) is arranged in an end-to-end configuration—or alternatively, in a side-by-side configuration—with the p-type transistor which is formed by operations 202. Such a configuration of circuit structures may provide at least in part functionality of a NAND logic gate (such as that of CMOS circuit 500).

Figure 6:
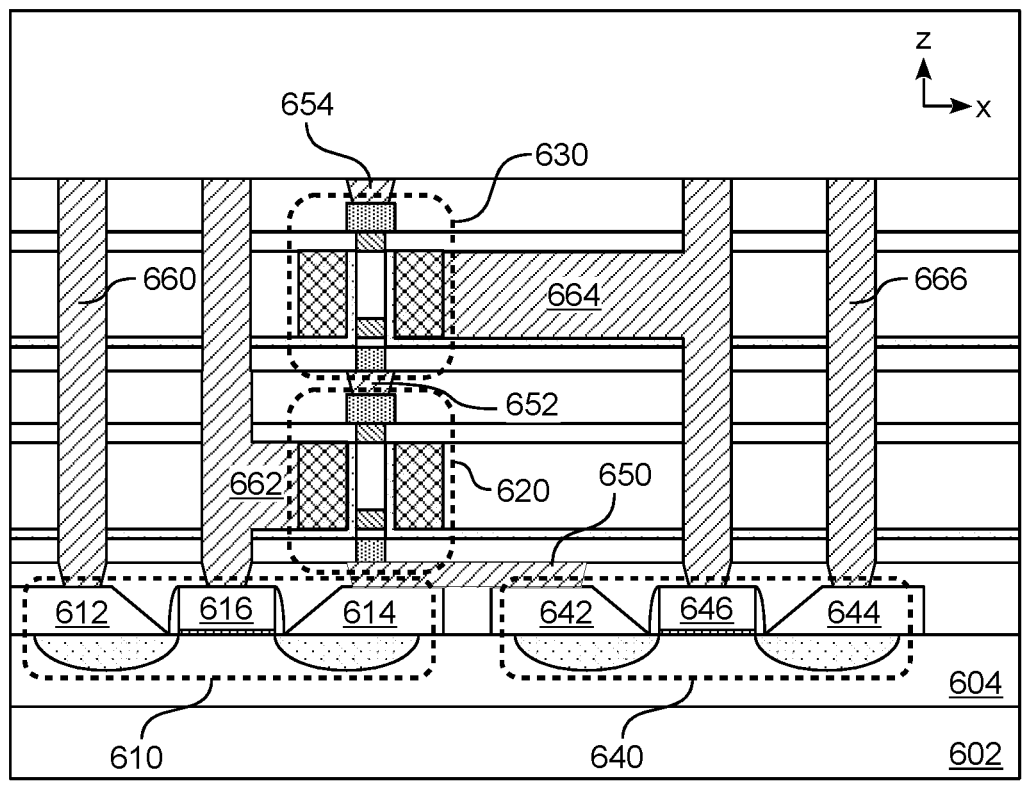
FIG. 6 shows a cross-sectional views of an integrated circuitry including a CMOS circuit according to an embodiment.

For example, FIG. 6 shows features of a circuit structures 600 according to an embodiment. Circuit structures 600 may include features of integrated circuitry 105. Alternatively or in addition, some or all of circuit structures 600 may be fabricated according to method 200. As shown in FIG. 6, circuit structures 600 may include a semiconductor material 604 disposed on a substrate 602—e.g., where semiconductor material 604 and substrate 602 correspond functionally to layer 130 and substrate 160, respectively.

Horizontal transistors variously formed in or on semiconductor material 604 may include p-type transistors 610, 640. In the example embodiment shown, p-type transistors 610, 640 are arranged in an end-to-end configuration along the x-axis shown. Alternatively, p-type transistors 610, 640 may overlap (and be offset from one another along a y-axis, orthogonal to the x-axis) in a side-by-side configuration. Connectivity to p-type transistor 610 may be provided via a gate structure 616 and source/drain structures 612, 614 thereof. Similarly, connectivity to p-type transistor 640 may be provided via a gate structure 646 and source/drain structures 642, 644 thereof.

Raised source/drain structure 614 and gate structure 616 may be variously coupled to respective interconnects 650, 662—e.g., where a vertical n-type TFT 620 is variously coupled to p-type transistor 610 via each of interconnects 650, 662. For example, interconnect 650 may be coupled directly to raised source/drain structure 614 and to a source/drain structure of n-type TFT 620. In such an embodiment, interconnect 662 may include a conductive path which extends to each of gate structure 616 and a gate structure of n-type TFT 620—e.g., wherein the conductive path is limited to a region over a horizontal footprint of p-type transistor 610. Vertical n-type TFT 620 may have some or all of the features of n-type TFT 311, for example.

Interconnect 650 may be further coupled to source/drain structure 642 of p-type transistor 640. In such an embodiment, another interconnect 664 of circuit structures 600 may be coupled directly to each of gate structure 646 and a gate structure of n-type TFT 630. Source/drain structures 612, 644 may be coupled to respective interconnects 660, 666—e.g., wherein another interconnect 654 is coupled to a source/drain of n-type TFT 630.

Functionality of transistors 610, 620, 630, and 640 may correspond (respectively) to that of transistors 510, 530, 540, and 520, for example. In such an embodiment, interconnects 660, 666 may be coupled to a supply voltage Vdd—e.g., wherein interconnect 654 is coupled to a reference potential, wherein interconnects 662, 664 are coupled to receive input signals A, B (respectively), and wherein interconnect 650 is to provide the output at node C. In one example implementation of circuit 500, transistors 510, 520, 530, 540 may be (respectively) transistors 610, 640, 620, 630. For example, interconnects 660, 666 may be coupled to provide a supply voltage Vdd, and interconnect 654 coupled to provide a reference voltage. In such an embodiment, interconnects 662, 664 may provide (respectively) input signal A and input signal B, wherein interconnect 650 is coupled to provide the output signal at node C.

Figure 7:
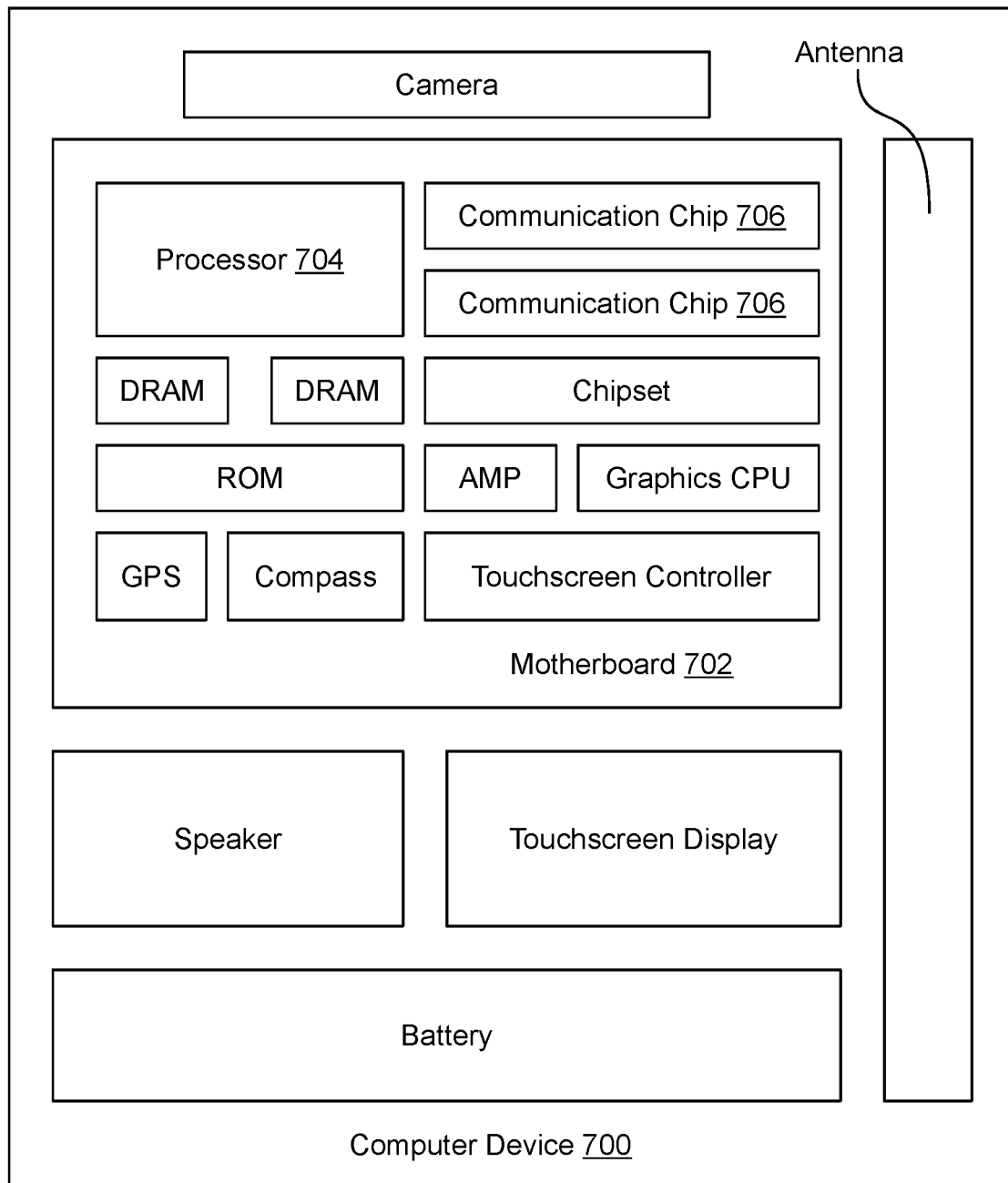
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
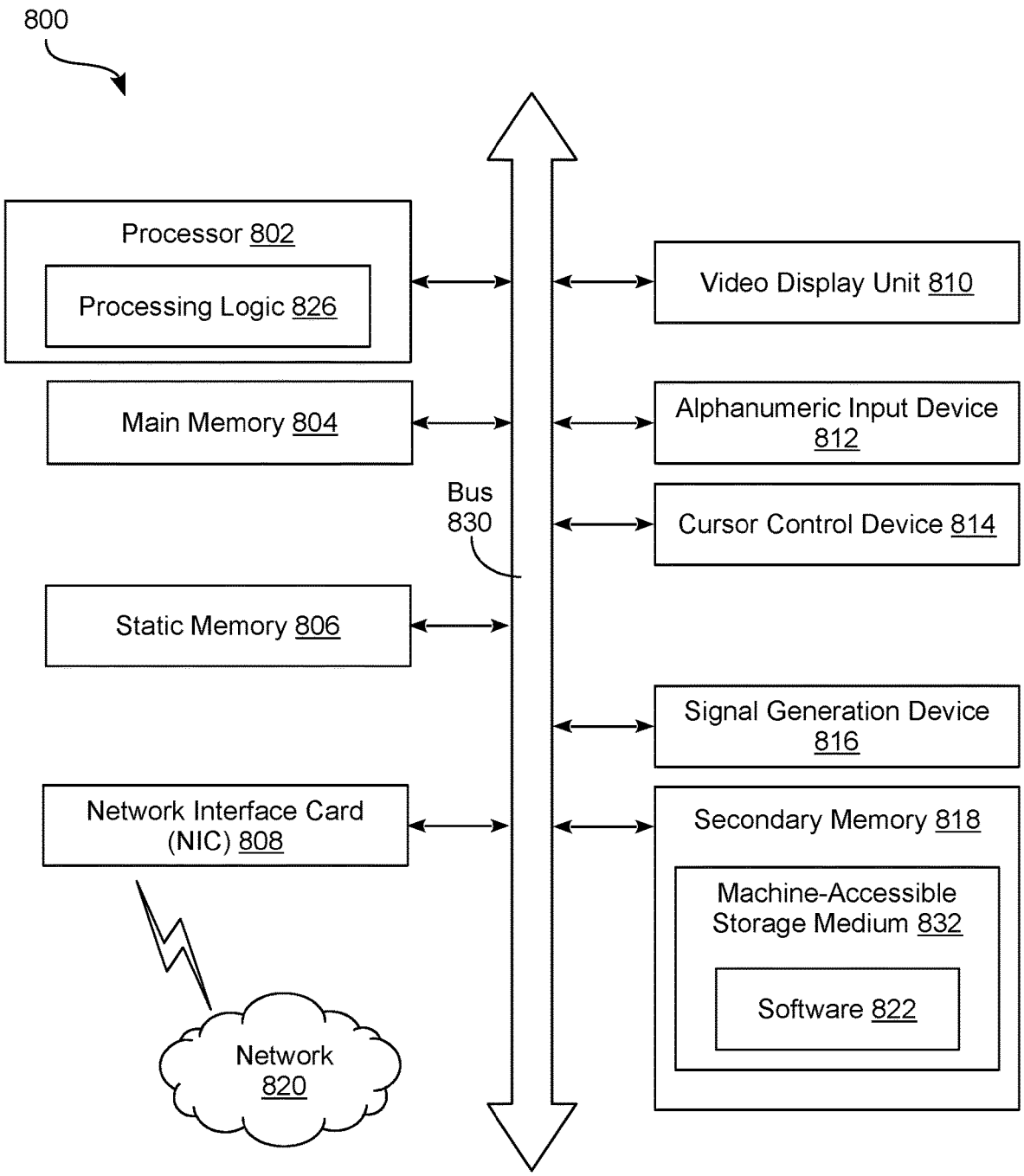
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for providing CMOS circuit structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
a p-type transistor on a substrate, the p-type transistor comprising a first drain, a first source, a first gate, and a first semiconductor body which extends between the first source and the first drain along a first line which is parallel to a surface of the substrate;
an n-type thin film transistor (TFT) comprising a second drain, a second source, a second gate, and a second semiconductor body which extends between the second source and the second drain along a second line which is orthogonal to the surface of the substrate, wherein the second gate surrounds the second semiconductor body, and wherein a carrier mobility of the second semiconductor body is equal to or greater than 100 cm$^2$/V·s;
a first interconnect coupled to each of the p-type transistor and the n-type TFT, wherein the first interconnect, one of the first source or the first drain, and one of the second source or the second drain are on the second line; and
a second interconnect comprising a conductive path which extends to each of the first gate and the second gate, wherein the conductive path is limited to a region over a footprint of the p-type transistor.

2. The integrated circuit of claim 1, wherein one of an inverter or a NAND gate includes the p-type transistor and the n-type TFT.

3. The integrated circuit of claim 1, further comprising:
a second n-type TFT comprising a third drain, a third source, and a third semiconductor body which extends between the third source and the third drain along the second line; and
a third interconnect structure coupled to each of the n-type TFT and the second n-type TFT, wherein the third interconnect is on the second line.

4. The integrated circuit of claim 3, further comprising:
a second p-type transistor on the substrate, the second p-type transistor comprising a fourth drain, a fourth source, a fourth gate, and a fourth semiconductor body which extends between the fourth source and the fourth drain along a third line which is parallel to the surface of the substrate; and
a fourth interconnect coupled to each of the third gate and the forth gate.

5. The integrated circuit of claim 4, wherein the p-type transistor and the second p-type transistor are arranged in a side-by-side configuration.

6. The integrated circuit of claim 1, wherein the second semiconductor body comprises oxygen and at least one of indium, gallium, zinc, titanium, or tin.

7. The integrated circuit of claim 1, wherein the p-type transistor comprises a second TFT.

8. A method comprising:
forming on a substrate a p-type transistor comprising a first drain, a first source, a first gate, and a first semiconductor body which extends between the first source and the first drain along a first line which is parallel to a surface of the substrate;
forming an n-type thin film transistor (TFT) comprising a second drain, a second source, a second gate, and a second semiconductor body which extends between the second source and the second drain along a second line which is orthogonal to the surface of the substrate, wherein the second gate surrounds the second semiconductor body, and wherein a carrier mobility of the second semiconductor body is equal to or greater than 100 cm$^2$/V·s;
coupling each of the p-type transistor and the n-type TFT to a first interconnect, wherein the first interconnect, one of the first source or the first drain, and one of the second source or the second drain are on the second line; and
forming a second interconnect comprising a conductive path which extends to each of the first gate and the second gate, wherein the conductive path is limited to a region over a footprint of the p-type transistor.

9. The method of claim 8, wherein one of an inverter or a NAND gate includes the p-type transistor and the n-type TFT.

10. The method of claim 8, further comprising:
forming a second n-type TFT comprising a third drain, a third source, and a third semiconductor body which extends between the third source and the third drain along the second line; and
coupling a third interconnect structure to each of the n-type TFT and the second n-type TFT, wherein the third interconnect is on the second line.

11. The method of claim 8, wherein the second semiconductor body comprises oxygen and at least one of indium, gallium, zinc, titanium, or tin.

12. The method of claim 8, wherein the second semiconductor body comprises an amorphous semiconductor.

13. The method of claim 8, wherein an average size of any crystallites of the second semiconductor body is in a range of 0.5 nanometers (nm) to 5 nm.

14. A system comprising:
   an integrated circuit (IC) comprising:
      a p-type transistor on a substrate, the p-type transistor comprising a first drain, a first source, a first gate, and a first semiconductor body which extends between the first source and the first drain along a first line which is parallel to a surface of the substrate;
      an n-type thin film transistor (TFT) comprising a second drain, a second source, a second gate, and a second semiconductor body which extends between the second source and the second drain along a second line which is orthogonal to the surface of the substrate, wherein the second gate surrounds the second semiconductor body, and wherein a carrier mobility of the second semiconductor body is equal to or greater than 100 cm$^2$/V·s;
      a first interconnect coupled to each of the p-type transistor and the n-type TFT, wherein the first interconnect, one of the first source or the first drain, and one of the second source or the second drain are on the second line; and
      a second interconnect comprising a conductive path which extends to each of the first gate and the second gate, wherein the conductive path is limited to a region over a footprint of the p-type transistor; and
   a display device coupled to the IC, the display device to generate a display based on a signal communicated with the IC.

15. The system of claim 14, wherein one of an inverter or a NAND gate includes the p-type transistor and the n-type TFT.

16. The system of claim 14, wherein the other of the first source or the first drain is coupled to receive a supply voltage.

17. The system of claim 16, wherein the other of the second source or the second drain is coupled to receive a ground voltage.

18. The system of claim 14, the integrated circuit further comprising:
   a second n-type TFT comprising a third drain, a third source, and a third semiconductor body which extends between the third source and the third drain along the second line; and
   a third interconnect structure coupled to each of the n-type TFT and the second n-type TFT, wherein the third interconnect is on the second line.

19. The system of claim 18, the integrated circuit further comprising:
   a second p-type transistor on the substrate, the second p-type transistor comprising a fourth drain, a fourth source, a fourth gate, and a fourth semiconductor body which extends between the fourth source and the fourth drain along a third line which is parallel to the surface of the substrate; and
   a fourth interconnect coupled to each of the third gate and the forth gate.

20. The system of claim 19, wherein the p-type transistor and the second p-type transistor are arranged in a side-by-side configuration.

21. The system of claim 14, wherein the second interconnect is coupled to receive a first signal representing a first logic state, and wherein the first interconnect is coupled to output a second signal representing a second logic state based on the first logic state.

22. The system of claim 14, wherein the second semiconductor body comprises oxygen and at least one of indium, gallium, zinc, titanium, or tin.

* * * * *